(12) United States Patent
Gardner et al.

(10) Patent No.: US 7,668,267 B2
(45) Date of Patent: *Feb. 23, 2010

(54) SEARCH EFFICIENT MIMO TRELLIS DECODER

(75) Inventors: James Gardner, San Ramon, CA (US); Vincent Knowles Jones, IV, Redwood City, CA (US); Didier Johannes Richard Van Nee, De Meern (NL); Geert Arnout Awater, Utrecht (NL)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/942,283

(22) Filed: Nov. 19, 2007

(65) Prior Publication Data

US 2008/0063104 A1 Mar. 13, 2008

Related U.S. Application Data

(63) Continuation of application No. 10/643,774, filed on Aug. 18, 2003, now Pat. No. 7,305,055.

(51) Int. Cl.
*H04B 7/10* (2006.01)
(52) U.S. Cl. .................. 375/347; 375/262; 375/265; 375/341; 714/795
(58) Field of Classification Search ............ 375/347; 370/208
See application file for complete search history.

(56) References Cited

U.S. PATENT DOCUMENTS

| 4,891,823 | A | 1/1990 | Cole |
| 6,473,467 | B1 | 10/2002 | Wallace et al. |
| 2006/0120273 | A1* | 6/2006 | Wang et al. ............... 370/208 |

OTHER PUBLICATIONS

Ungerboeck, "Trellis-Coded Modulation with Redundant Signal Sets Part I," IEEE Communications Magazine, vol. 25, No. 2, Feb. 1987.

(Continued)

*Primary Examiner*—David C Payne
*Assistant Examiner*—Adolf Dsouza
(74) *Attorney, Agent, or Firm*—Turocy & Watson, LLP

(57) ABSTRACT

A decoder generates distance and label metrics associated with each label of a coset transmitted in a multi-input multi-output communication system having $M_t$ transmit antennas and $M_r$ receive antennas by performing $2^{(u+n)(M_t-1)}$ searches, where n is the number of encoded bits used to identify one of $2_n$ cosets at the transmitting end and u is the number of unencoded bits used to select one of $2_u$ labels at the transmitting end. The decoder forms an intermediate vector quantity associated with one of the transmit antennas to compute the metrics associated with each of the remaining transmit antennas. The decoder then forms a second intermediate vector quantity to compute the metrics associated with the transmit antenna that was used to form the first intermediate variable. The metrics so computed are used by a Viterbi decoder to identify the coset and the most likely transmitted label in that coset.

18 Claims, 3 Drawing Sheets

OTHER PUBLICATIONS

Ungerboeck, "Trellis-Coded Modulation with Redundant Signal Sets Part 11," IEEE Communications Magazine, vol. 25, No. 2, Feb. 1987.

Viterbi, "Error Bounds for Convolutional Codes and an Asymptotically Optimum Decoding Algorithm," IEEE ran&. on Information Theory, vol. IT-13, No. 2, Apr. 1967.

G. D. Forney, Jr., "Maximum-Likelihood Sequence Detection in the Presence of Intersytnbol Interference," IEEE Trans. on Information Theory, vol. IT-1 8, No. 3, pp. 363-378, May 1972.

G. D. Forney, Jr., "The Viterbi Algorithm," IEEE Proceedings, vol. 61, pp. 268-278, No. 3, Mar. 1973.

* cited by examiner

SEARCH EFFICIENT MIMO TRELLIS DECODER

CROSS REFERENCE TO RELATED APPLICATIONS

This application is a Continuation of U.S. patent application Ser. No. 10/643,774, filed on Aug. 18, 2003, entitled "SEARCH-EFFICIENT MIMO TRELLIS DECODER", the entirety of which is incorporated herein by reference.

BACKGROUND OF THE INVENTION

The present invention relates to digital communication, and more particularly to trellis coding used with multiple-input multiple output communication systems.

Demand for wireless digital communication and data processing systems is on the rise. Inherent in most digital communication channels are errors introduced when transferring frames, packets or cells containing data. Such errors are often caused by electrical interference or thermal noise. Data transmission error rates depend, in part, on the medium which carries the data. Typical bit error rates for copper based data transmission systems are in the order of $10^{-6}$. Optical fibers have typical bit error rates of $10^{-9}$ or less. Wireless transmission systems, on the other hand, may have error rates of $10^{-3}$ or higher. The relatively high bit error rates of wireless transmission systems pose certain difficulties in encoding and decoding of data transmitted via such systems. Partly because of its mathematical tractability and partly because of its application to a broad class of physical communication channels, the additive white Gaussian noise (AWGN) model is often used to characterize the noise in most communication channels.

Data is often encoded at the transmitter, in a controlled manner, to include redundancy. The redundancy is subsequently used by the receiver to overcome the noise and interference introduced in the data while being transmitted through the channel. For example, the transmitter might encode k bits with n bits where n is greater than k, according to some coding scheme. The amount of redundancy introduced by the encoding of the data is determined by the ratio n/k, the inverse of which is referred to as the code rate. Codewords representing the n-bit sequences are generated by an encoder and delivered to a modulator that interfaces with the communication channel. The modulator maps each received sequence into a symbol. In M-ary signaling, the modulator maps each n-bit sequence into one of $M=2^n$ symbols. Data in other than binary form might be encoded, but typically data is representable by a binary digit sequence.

To gain bandwidth efficiency and coding, Trellis Coded Modulation (TCM) has been developed and combines a multilevel phase modulation signaling set with a trellis coding scheme. TCM increases the minimum Euclidean distance between pairs of coded signals to reduce the loss from the expansion of signal set and to achieve coding gain with relatively relatively simple codes. The TCM is described, e.g., in Ungerboeck, "Trellis-Coded Modulation with Redundant Signal Sets Part I," IEEE Communications Magazine, Vol. 25, February 1987; and in Ungerboeck, "Trellis-Coded Modulation with Redundant Signal Sets Part II," IEEE Communications Magazine, Vol. 25, February 1987, both of which are incorporated herein by reference for all purposes.

At the receiving end of a transmission channel, the coded symbols must be decoded. The Viterbi algorithm is an efficient maximum-likelihood sequence detection method for decoding convolutional and trellis coded symbols transmitted over AWGN channels. The Viterbi algorithm is described in a number of publications. See for example, Viterbi, "Error Bounds for Convolutional Codes and an Asymptotically Optimum Decoding Algorithm", IEEE Trans. on Information Theory, Vol. IT-13, April 1967; G. D. Forney, Jr., "Maximum-Likelihood Sequence Detection in the Presence of Intersymbol Interference" IEEE Trans. on Information Theory, Vol. IT-18, pp. 363-378, May 1972; and G. D. Forney, Jr., "The Viterbi Algorithm", IEEE Proceedings, Vol. 61, pp. 268-278, March 1973, all of which are incorporated herein by reference for all purposes.

In accordance with the Viterbi algorithm, for each received signal, a distance between that signal at time $t_i$ and all the trellis paths entering each state at time $t_i$ is calculated. In the Viterbi algorithm, the minimum Euclidean distance is selected as the optimum branch metric for decoding convolutional and trellis sequences transmitted in AWGN channels.

To increase the data rate and the operating range without increasing the bandwidth, multiple input multiple output (MIMO) systems have been developed. In a MIMO system, the transmitter includes multiple transmit antennas and the receiver includes multiple receive antennas. The transmitter splits the data to be transmitted into a number of streams (typically bit streams) and transmits the streams via the multiple transmit antennas. The receiver receives the transmitted streams via the multiple receive antennas. The labeling convention used herein for alphanumeric symbols represents scaler quantities as italic symbols, vectors as lowercase bold symbols, and matrices as uppercase bold symbols. Unless otherwise indicated, it is understood that each scaler quantity, vector component or matrix element can be a complex number.

FIG. 1 is a simplified block diagram of a prior art MIMO TCM encoder 10. TCM encoder 10 includes a serial-to-parallel converter 12, a convolutional encoder 14, a symbol mapper 16 and a serial-to-parallel converter 18. The MIMO system (not shown) of which MIMO TCM encoder 10 is a part, includes $M_t$ transmit antennas and $M_r$ receive antennas (not shown). The channel through which the data encoded by TCM encoder 10 is transmitted is characterized by the complex matrix H having the dimensions of $M_r \times M_t$. The channel is assumed to be an AWGN channel. Convolutional encoder 14 in conjunction with symbol mapper 14 perform the TCM encoding.

Unencoded data bit streams arrive at serial-to-parallel converter 12 (hereinbelow referred to alternatively as converter 12). Out of every u+k bits that serially arrive at converter 12, u bits are delivered in parallel to symbol mapper 16 and k bits are delivered in parallel to convolutional encoder 14. The k-bits are encoded by convolutional encoder 14 which has a code rate of k/n. Symbol mapper 16 uses the n encoded bits to select one of $2^n$ cosets of symbols, each having $2^u$ labels. Symbol mapper 16 then uses the u unencoded bits to select one of the $2^u$ labels from the selected coset. Each label so selected is a complex number having a real and an imaginary component. Serial-to-parallel converter 18 converts the serial bit streams associated with each selected label to $M_t$ parallel bits, which are transmitted by the corresponding $M_t$ transmit antennas. Accordingly, each transmitted vector y has $M_t$ complex components. Each received vector r has the dimension of $M_r$ and is represented by the following expression:

$$r = Hy + v$$

where v is the noise and/or interference vector which is assumed to have a spatial auto-covariance matrix.

FIG. 2 is a simplified block diagram of a prior art MIMO TCM decoder 30 that is adapted to decode the data encoded by TCM encoder 10 after this data is transmitted. MIMO TCM decoder 30 includes a Logarithmic Maximum A Posteriori (Log-MAP) decoder 30, a Viterbi trellis decoder 34, a selector 36 and a parallel-to-serial converter 38. Log-MAP decoder 32 is supplied with the received vector r and the channel matrix H and, in response, generates an estimate for each of the transmitted symbols; this estimate is also referred to as a soft decision of the decoded symbol. In particular, Log-MAP decoder 32 finds the Euclidean distance between the received vector r and the nearest label in each coset for one antenna by searching over all other possible transmitted labels on the other $M_t-1$ antennas and does this for each antenna. For each coset j, for all possible labels in coset j and for each transmit antenna i, Log-MAP decoder 32 computes a distance metric d(i, j) and a corresponding label metric label(i, j), as shown below:

$$d(i, j) = \min_{k}(r - HX(k))^H \Lambda^{-1}(r - HX(k)) \quad (1)$$

$$\text{label}(i, j) = \operatorname*{argmin}_{k}(r - HX(k))^H \Lambda^{-1}(r - HX(k)) \quad (2)$$

In the above equations (1) and (2):
  H: is the channel estimate matrix,
  $\Lambda^{-1}$: is the inverse of the auto-covariance matrix of any of the antennas,
  X: is a $M_t$ by CL matrix of the possible transmitted symbol combinations on all the $M_t$ antennas, where $C=2^n$ is the number of cosets, and $L=2^u$ is the number of labels in each coset.
  X(k): represents all rows of matrix X that have an element of coset k in their ith column.

Metrics d(i, j) and label(i, j) so computed are supplied to Viterbi (trellis) decoder 34 and selector 36, respectively. Viterbi decoder 34 assigns the same distance d(i,j) to all edges in the trellis that generate an output with elements from coset j. The metrics d(i,j) and label(i,j) corresponding to each transmit antenna i are applied to associated transitions of the trellis. For instance, the distance and label metrics associated with transmit antenna 1 are applied to the following transitions in the trellis:
  0, $M_t$, 2 $M_t$ . . .

Similarly, the distances and label metrics associated with transmit antenna 2 are applied to the following transitions in the trellis:
  1, $M_t+1$, 2 $M_t+1$, . . .

Viterbi decoder 34 identifies the most likely k unencoded bits received by converter 12 (see FIG. 1) and the corresponding coset for each channel instance. The most likely coset returned from Viterbi decoder 34 is supplied to selector 36. Using the cosets received from Viterbi decoder 34, selector 36 identifies the most likely u unencoded bits and the corresponding labels for each channel instance. Parallel-to-serial converter 38 receives the bit streams associated with the cosets and labels in parallel—as identified by Viterbi decoder 34 and selector 36—and serializes these bit streams at its output terminals.

Prior art decoder 30 performs $p=2^{(u+n)*Mt}$ searches to identify the transmitted symbols at the receiving end. As the number of constellation signals (i.e., the symbol set) increases, the number of searches required to identify the transmitted symbols increases by a large factor. It would be desirable to have a decoder adapted to perform fewer searches to identify the transmitted symbols than conventional decoders.

BRIEF SUMMARY OF THE INVENTION

In accordance with the present invention, a decoder generates one or more metrics associated with each symbol of a symbol coset transmitted in a multi-input multi-output communication system having $M_t$ transmit antennas and $M_r$ receive antennas by performing on the order of $2^{(u+n)(Mt-1)}$ searches, where n is the number of encoded bits used to select one of $2^n$ cosets at the transmitting end and u is the number of unencoded bits used to select one of $2^u$ symbols at the transmitting end, for each of the $M_t$ antennas. The metrics are subsequently used by a Viterbi decoder to identify the coset and their corresponding transmitted symbols.

To perform the above search, the decoder receives vector r of the received symbols received on the Mr receive antennas and a channel matrix H having $M_t$ rows and $M_r$ columns to characterize the channel between the Mt transmit antennas and the $M_r$ receive antennas. Next, the decoder forms a vector quantity $xopt_1$ representing an optimized guess for the symbol transmitted by a first one of the transmit antennas and whose elements are defined by a combination of a first column $h_1$ of matrix H, the remaining columns $H_{n \neq 1}$ of matrix H and a matrix X of possible symbols transmitted on the remaining transmit antennas. Matrix X thus includes $(M_{t-1})$ rows and $2^{u+n}$ columns. The decoder then uses the vector quantity $xopt_1$ to compute a distance metric and a label metric associated with each of the remaining transmit antennas. Next, the decoder forms another vector quantity $xopt_2$ representing another optimized guess associated with a second one of the transmit antennas. Accordingly, vector quantity $xopt_2$ includes elements defined by a combination of a second column $h_2$ of matrix H, the remaining columns $H_{n \neq 2}$ of matrix H, and matrix X. The decoder uses the vector quantity $xopt_2$ to compute a distance metric and a label metric associated with the first transmit antenna. The first and second antennas could be any pair of transmit antennas.

In one embodiment, the vector quantities $xopt_1$ and $xopt_2$ are computed using the following equations:

$$xopt_1 = \left[\frac{\Lambda^{-1}(h_1^* r - h_1^* H_{n \neq 1} X)}{h_1^* h_1}\right]$$

$$xopt_2 = \left[\frac{\Lambda^{-1}(h_2^* r - h_2^* H_{n \neq 2} X)}{h_2^* h_2}\right]$$

where vector $h_1$* is the complex conjugate transpose of vector $h_1$, and vector $h_2$* is the complex conjugate transpose of vector $h_2$. The distance metric associated with each, except the first, transmit antenna is computed using the following equation:

$$d(i, j) = \min_{k}(r - h_1 xopt_1(k) - H_{n \neq 1} X(k))^H \Lambda^{-1}(r - h_1 xopt_1(k) - H_{n \neq 1} X(k))$$

where $h_1$ is the $1^{st}$ column of Matrix H, $H_{n \neq 1}$ are all but the remaining columns of matrix H, $\Lambda^{-1}$ is the auto-covariance of any of the transmit antennas, X(k) represents all rows of matrix X which have an element of coset k in their $i^{th}$ column, and $xopt_1(k)$ represents those elements of vector $xopt_1$ that belong to coset k. The label metric associated with each, except the first, transmit antenna is computed using the following equation:

$$\text{label}(i, j) = \underset{k}{\arg\min}(r - h_1 xopt_1(k) - H_{n\neq 1}X(k))^H \Lambda^{-1}(r - h_1 xopt_1(k) - H_{n\neq 1}X(k))$$

The distance and label metrics associated with the first transmit antenna are respectively obtained using the following equations:

$$d(1, j) = \underset{k}{\min}(r - h_2 xopt_2(k) - H_{n\neq 2}X(k))^H \Lambda^{-1}(r - h_2 xopt_2(k) - H_{n\neq 2}X(k))$$

$$\text{label}(1, j) = \underset{k}{\arg\min}(r - h_2 xopt_2(k) - H_{n\neq 2}X(k))^H \Lambda^{-1}(r - h_2 xopt_2(k) - H_{n\neq 2}X(k))$$

The decoder then supplies the distance and label metrics associated with each transmit antenna to a Viterbi decoder which, in response, identifies the received symbols.

DETAILED DESCRIPTION OF THE INVENTION

Figure 1:
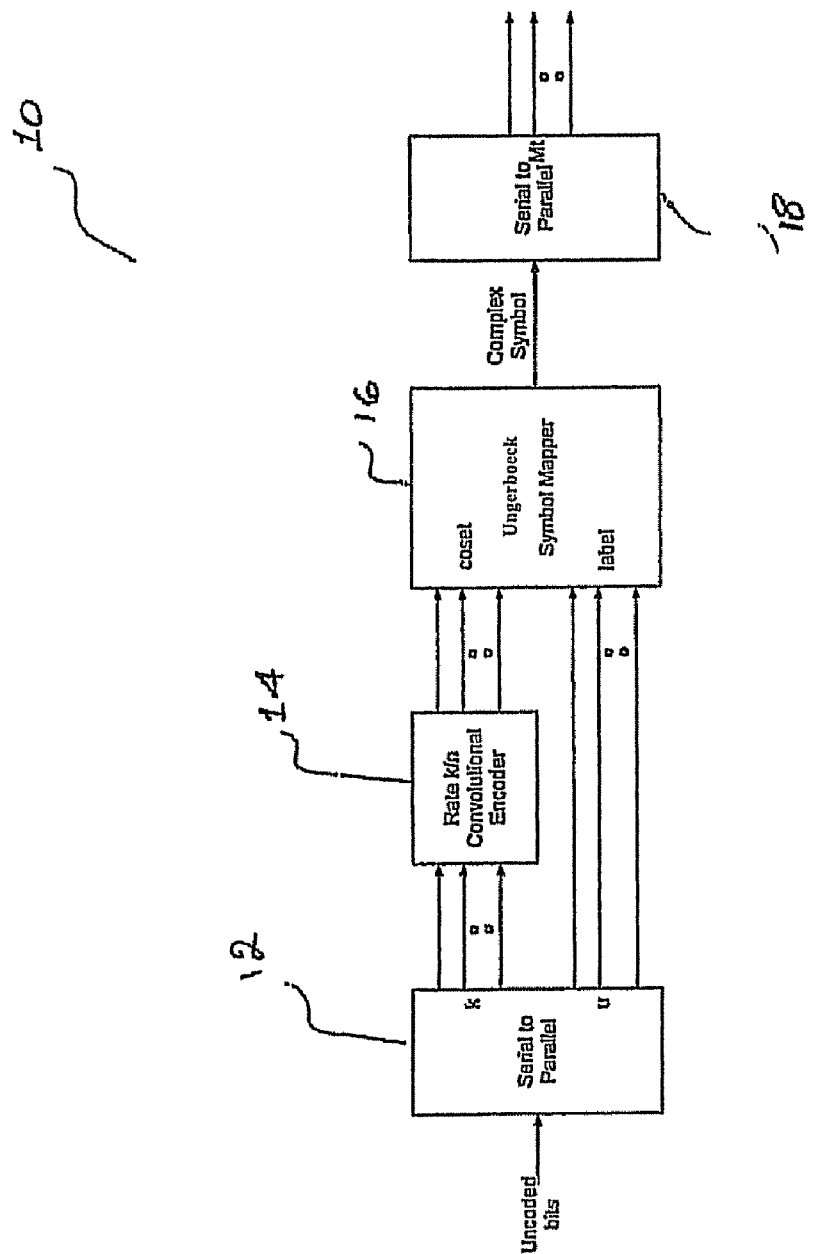
FIG. 1 is a simplified block diagram of a MIMO TCM encoder, as known in the prior art.
Figure 2:
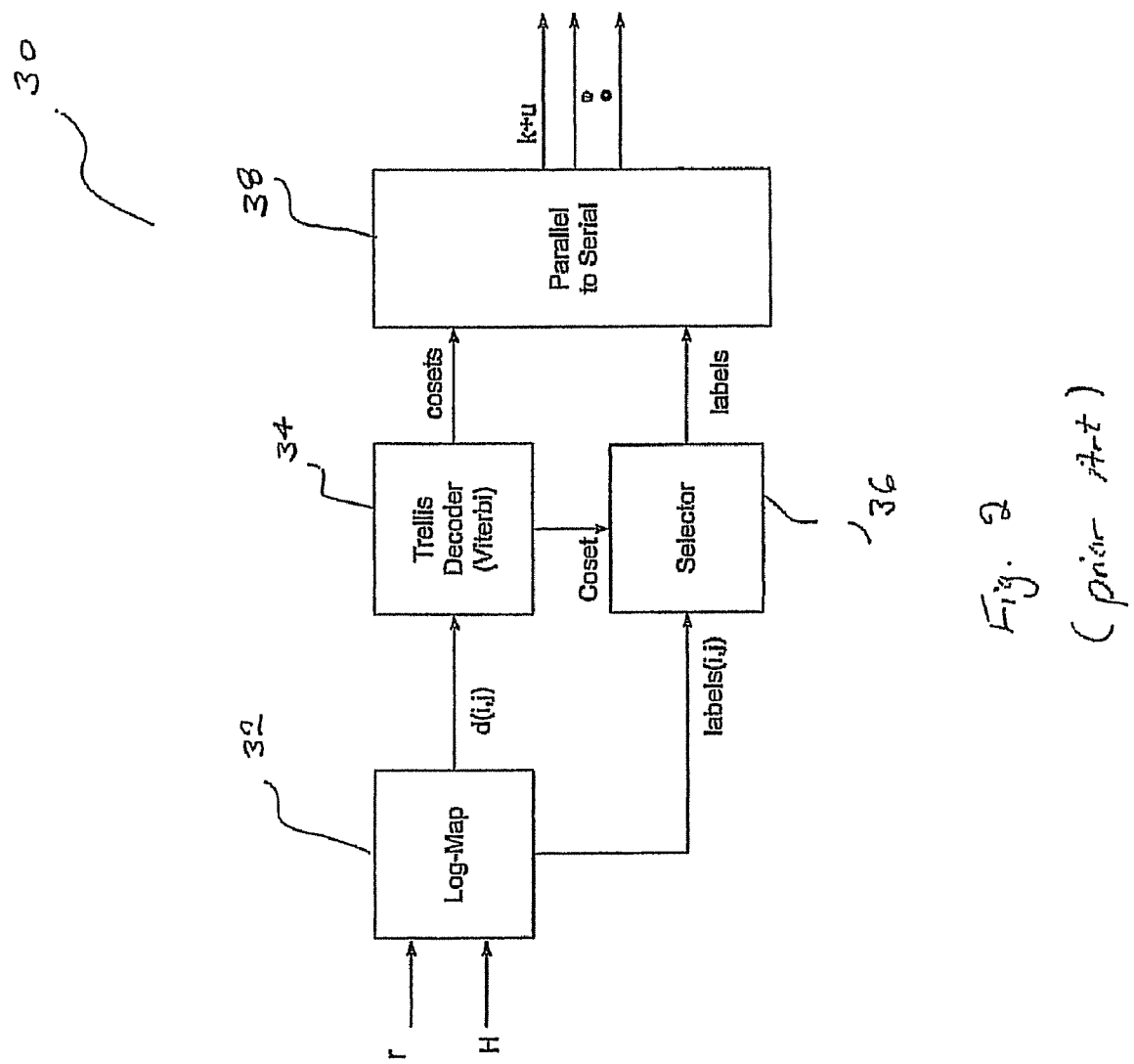
FIG. 2 is a simplified block diagram of a MIMO TCM decoder, as known in the prior art.
Figure 3:
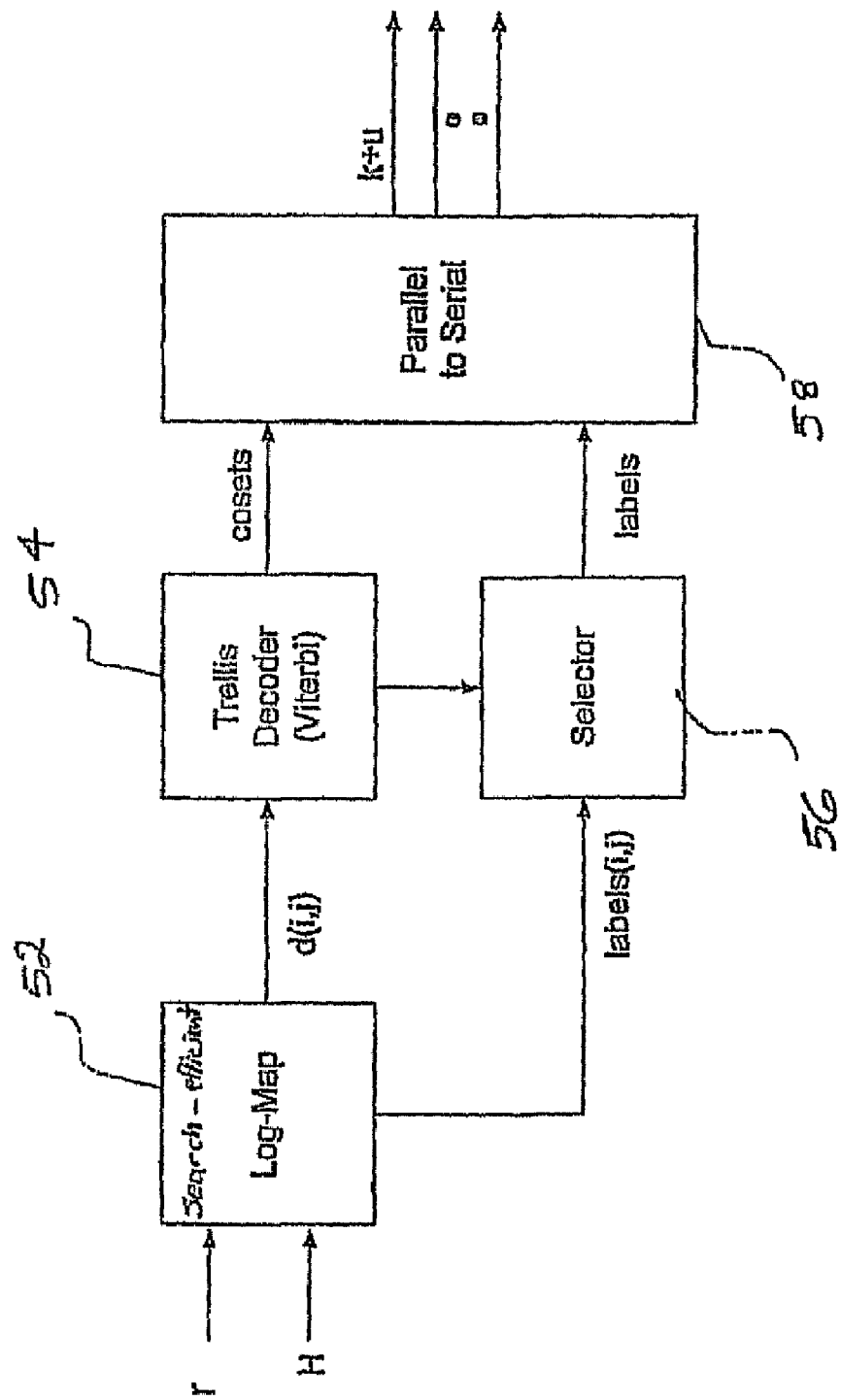
FIG. 3 is a simplified block diagram of a MIMO TCM decoder including a search-efficient Log-MAP decoder, in accordance with one embodiment of the present invention.

FIG. 3 is a simplified block diagram of a MIMO TCM decoder 50, in accordance with one embodiment of the present invention. MIMO TCM decoder 50 includes, in part, a search-efficient Log-MAP decoder 52, a Viterbi decoder 54, a selector 56 and a parallel-to-serial converter 58. MIMO TCM decoder 50 is adapted to decode symbols encoded via, for example, the prior art encoder shown in FIG. 1, and transmitted via a channel with a characteristic estimate matrix H.

At the transmitting end (not shown), out of every u+k bits, k-bits are encoded by a convolutional encoder that has a code rate of k/n. The n encoded bits are used to select one of $2^n$ cosets, each having two $2^u$ labels. The u unencoded bits are subsequently used to select one of the $2^u$ labels from the selected coset. Each label so selected is a complex number having a real and an imaginary component. The serial bit stream associated with each selected label is converted to $M_t$ parallel bits, and is subsequently transmitted by the corresponding $M_t$ transmit antennas.

In the following, it is assumed that encoded data are transmitted on $M_t$ transmit antennas and are received on $M_r$ receive antennas. Therefore, each transmitted symbol vector y has $M_t$ complex components. It is further assumed that each received vector symbol r has the dimension of $M_r$ and is represented by the following expression:

$$r = Hy + v$$

where v is the noise and/or interference vector which is assumed to have a spatial auto-covariance matrix.

In accordance with the present invention, search-efficient Log-MAP decoder 52 performs $p = 2^{(u+n)*(M_t-1)}$ searches to determine a distance metric (alternatively referred to hereinbelow as a distance) and a label metric (alternatively referred to hereinbelow as a label) associated with each transmitted symbol. The search results are subsequently supplied to Viterbi decoder 54 and selector 56, as part of the label decoding process. For each transmit antenna, a set of associated distances and labels are computed for each $m^{th}$ channel instance given the channel estimates H(m) (alternatively referred to hereinbelow as H) and the received vector r(m) (alternatively referred to hereinbelow as r). A channel instance is associated with one of the $M_t$ transmit antennas and one of the $M_r$ receive antennas, so the $M^{th}$ channel instance is one of $M_t \times M_r$ channel instances. To make this computation for each transmit antenna, the effects of the other $M_t-1$ antennas are first removed, as described further below.

First, one of the transmit antennas (e.g., the first transmit antenna) is selected from the linear array of $M_t$ transmit antennas, to form an associated intermediate vector quantity. It is understood that any one of the $M_t$ transmit antennas could be selected as the first transmit antenna. An associated intermediate vector quantity $xopt_1$ is computed for the first transmit antenna as follows:

$$xopt_1 = \left[\frac{\Lambda^{-1}(h_1^* r - h_1^* H_{n\neq 1} X)}{h_1^* h_1}\right]$$

where:
$h_1$: is the first column of channel estimate matrix H,
$H_{n\neq 1}$: are the remaining columns of H,
$\Lambda^{-1}$: is the inverse of the auto-covariance matrix of any of the transmit antennas,
X: is a $(M_t-1)$ by CL matrix of the p possible transmitted symbol combinations on the $M_t-1$ other antennas, where $C=2^n$ is the number of cosets, and $L=2^u$ is the number of labels in each coset.

It is understood that any one of the $M_t$ transmit antennas may be selected to form the intermediate variable, as described above. Therefore, it is understood that the selection of the first transmit antenna to form the intermediate variable $xopt_1$, in accordance with the above, does not imply a constraint to some canonicalization of physical antennas.

The distance between the received vector r and the nearest label in each coset is determined for each antenna by searching over all other possible transmit symbols sets on the other $M_t-2$ antennas with $xopt_1$ representing the most likely sequence transmitted on the first antenna. In other words, for each transmit antenna i (i is an integer varying from 1 to $M_t$), except the first transmit antenna (i.e., i=1) for all L possible labels in each coset j, a distance d (i, j) is calculated as shown below:

$$d(i, j) = \underset{k}{\min}(r - h_1 xopt_1(k) - H_{n\neq 1}X(k))^H \Lambda^{-1}(r - h_1 xopt_1(k) - H_{n\neq 1}X(k))$$

where:
X(k): represents all rows of matrix X which have an element of coset k in their $i^{th}$ column,
$xopt_1(k)$: represents those elements of vector $xopt_1$ that belong to coset k.

Edges in the trellis that generate an output with elements from coset j, can be assigned the same distance d(i, j). The distances are computed for each of the other transmit antennas, i=2, ... $M_t$. Next, using the channel estimates H and r, the corresponding labels are computed for each edge in the trellis decoder, as shown below:

$$\text{label}(i, j) = \underset{k}{\text{argmin}}(r - h_1 xopt_1(k) - H_{n\neq 1}X(k))^H \Lambda^{-1}(r - h_1 xopt_1(k) - H_{n\neq 1}X(k))$$

Following the computation of the distance metrics d(i,j) for all possible labels L in each coset j for each antenna i≠1 and after the corresponding labels label(i,j) are determined for each antenna i≠1, the distance metric associated with the first antenna is determined by removing the effects of another antenna (e.g., i=2) and repeating the above computations. In other words, after distance metrics d(i,j) and label metrics label(i,j) are determined for each antenna i≠1 for all L possible labels in each coset j, the following vector quantity is calculated:

$$xopt_2 = \begin{bmatrix} \Lambda^{-1}(h_2^* r - h_2^* H_{n\neq 2}X) \\ h_2^* h_2 \end{bmatrix}$$

Vector quantity $xopt_2$ is subsequently used in computing the distances and labels associated with the first antenna and coset j, as shown below:

$$d(1, j) = \underset{k}{\min}(r - h_2 xopt_2(k) - H_{n\neq 2}X(k))^H \Lambda^{-1}(r - h_2 xopt_2(k) - H_{n\neq 2}X(k))$$

$$\text{label}(1, j) = \underset{k}{\text{argmin}}(r - h_2 xopt_2(k) - H_{n\neq 2}X(k))^H \Lambda^{-1}(r - h_2 xopt_2(k) - H_{n\neq 2}X(k))$$

The distances d(i,j) and labels label(i,j) corresponding to each transmit antenna are applied to associated transitions of the trellis. For instance, the distances and labels associated with the first transmit antenna (i.e., i=1) are applied to the following trellis transitions:

0, $M_t$, 2 $M_t$ ...

Similarly, the distances and labels associated with the second transmit antenna (i.e., i=2) are applied to the following trellis transitions:

1, $M_t$+1, 2 $M_t$+1, ...

Viterbi decoder 54 receives the distances d(i,j) and labels label(i,j) generated by search-efficient Log-MAP 52. In response, Viterbi decoder 54 identifies the most likely transmitted coset. Using the cosets identified by Viterbi decoder 54 and the labels generated by search-efficient LOG-MAP 52, selector 54 selects the transmitted label belonging to coset identified by Viterbi decoder 54. Parallel-to-serial converter 58 receives the cosets and label streams supplied by Viterbi decoder 54 and selector 56 in parallel. In response, parallel-to-serial converter 58 supplies these streams serially at its output terminals.

As seen from the above equations, the reduced LOG-MAP decoder, in accordance with the present invention, performs $2^{(u+n)(M_t-1)}$ searches in order to identify the most likely coset and the most likely transmitted label from the identified coset.

It is understood that search-efficient Log-MAP decoder 52, in accordance with the present invention, may be implemented by software code executed by a central processing unit, by dedicated hardware or by a combination of hardware and software.

The above embodiments of the present invention are illustrative and not limitative. The invention is not limited by the number of deployed transmit or receive antennas. The invention is not limited by the number of cosets or the number of labels within each coset. For example, the present invention would also work where $M_t$ or $M_r$ falls to one or is set to one (effectively resulting in a SIMO or MISO system) or a system with $M_r$=1 at the outset, although the improvement over an exhaustive search might be less than with a MIMO system. The invention is not limited by the number of bits used to select a coset or the number of bits used to select a label from a coset. Other additions, subtractions or modifications are obvious in view of the present invention and are intended to fall within the scope of the appended claims.

What is claimed is:

1. A computer implemented method for decoding information transmitted by a transmitter having a set of transmit antennas and received by a receiver having a set of receive antennas, comprising:
    using one or more processors to perform at least a portion of one or more of the following acts:
    receiving a vector r and a channel matrix;
    forming a first intermediate vector from the received vector r and a channel matrix, the first intermediate vector representing an optimized guess for a symbol transmitted by a first one of the set of transmit antennas;
    using the first intermediate vector to compute a distance metric and a label metric associated with each of the other transmit antennas;
    forming a second intermediate vector from the received vector r and the channel matrix, the second vector quantity representing an optimized guess relating to a second one of the set of transmit antennas;
    using the second intermediate vector to compute a distance metric and a label metric associated with the first transmit antenna; and
    using the distance metrics and label metrics to determine the received information.

2. The method of claim 1 farther comprising supplying the distance and label metrics to a Viterbi decoder, the Viterbi decoder for identifying a most likely coset associated with the received information.

3. The method of claim 1 further comprising determining the distance between each vector and a nearest label in each coset for each antenna by searching over all possible transmit symbol sets on other antennas.

4. The method of claim 1, wherein the first intermediate vector is determined using a combination of a first column of the matrix, remaining columns of the matrix, and a matrix X of possible symbols transmitted on the remaining transmit antennas.

5. The method of claim 1, wherein the first intermediate vector is calculated using the following formula:

$$\begin{bmatrix} \Lambda^{-1}(h_1^* r - h_1^* H_{n\neq 1}X) \\ h_1^* h_1 \end{bmatrix}$$

wherein $^{-1}$ is the inverse auto-covariance of any of the transmit antennas, $h_1^*$ is the complex conjugate transpose of $h^1$, and r is the vector r.

6. A computer readable medium having stored thereon computer executable instructions for determining information transmitted by a transmitter having a set of transmit antennas and received by a receiver having a set of receive antennas, comprising instructions for:
receiving a vector r and a channel matrix;
forming a first intermediate vector from the received vector r and a channel matrix, the first intermediate vector representing an optimized guess for a symbol transmitted by a first one of the set of transmit antennas;
using the first intermediate vector to compute a distance metric and a label metric associated with each of the other transmit antennas;
forming a second intermediate vector from the received vector r and the channel matrix, the second intermediate vector representing an optimized guess relating to a second one of the set of transmit antennas;
using the second intermediate vector to compute a distance metric and a label metric associated with the first transmit antenna; and
using the distance metrics and label metrics to determine the received information.

7. The computer readable medium of claim 6, wherein the received information is determined by providing the distance and label metrics to a Viterbi decoder, the Viterbi decoder for identifying a most likely coset associated with the received information.

8. The computer readable medium of claim 6, having stored thereon farther computer executable instructions for determining the distance between each vector and a nearest label in each coset for each antenna by searching over all possible transmit symbol sets on other antennas.

9. The computer readable medium of claim 6, wherein the first intermediate vector is determined using a combination of a first column of the matrix, remaining columns of the matrix, and a matrix X of possible symbols transmitted on the remaining transmit antennas.

10. The computer readable medium of claim 6, wherein the first intermediate vector is calculated using the following formula:

$$\left[ \frac{\Lambda^{-1}(h_1^* r - h_1^* H_{n \neq 1} X)}{h_1^* h_1} \right]$$

wherein $^{-1}$ is the inverse auto-covariance of any of the transmit antennas, $h_1^*$ is the complex conjugate transpose of $h_1$, and r is the vector r.

11. A processor that executes computer executable instructions, stored on a computer readable medium, for determining information transmitted by a transmitter having a set of transmit antennas and received by a receiver having a set of receive antennas, comprising instructions for:
receiving a vector r and a channel matrix;
forming a first intermediate vector from the received vector r and a channel matrix, the first intermediate vector representing an optimized guess for a symbol transmitted by a first one of the set of transmit antennas;
using the first intermediate vector to compute a distance metric and a label metric associated with each of the other transmit antennas;
forming a second intermediate vector from the received vector r and the channel matrix, the second intermediate vector representing an optimized guess relating to a second one of the set of transmit antennas;
using the second intermediate vector to compute a distance metric and a label metric associated with the first transmit antenna; and
using the distance metrics and label metrics to determine the received information.

12. The processor of claim 11, wherein the received information is determined by supplying the distance and label metrics to a Viterbi decoder, the Viterbi decoder for identifying a most likely coset associated with the received information.

13. The processor of claim 11, further for determining the distance between each vector and a nearest label in each coset for each antenna by searching over all possible transmit symbol sets on other antennas.

14. The processor of claim 11, wherein the first intermediate vector is determined using a combination of a first column of the matrix, remaining columns of the matrix, and a matrix X of possible symbols transmitted on the remaining transmit antennas.

15. The processor of claim 11, wherein the first intermediate vector is calculated using the following formula:

$$\left[ \frac{\Lambda^{-1}(h_1^* r - h_1^* H_{n \neq 1} X)}{h_1^* h_1} \right]$$

wherein $^{-1}$ is the inverse auto-covariance of any of the transmit antennas, $h_1^*$ is the complex conjugate transpose of $h_1$, and r is the vector r.

16. An apparatus for determining information transmitted by a transmitter having a set of transmit antennas and received by a receiver having a set of receive antennas, comprising:
a memory for storing a vector r and a channel matrix;
a processor for forming a first intermediate vector from the received vector r and a channel matrix, the first intermediate vector representing an optimized guess for a symbol transmitted by a first one of the set of transmit antennas, for using the first intermediate vector to compute a distance metric and a label metric associated with each of the transmit antennas except for the first antenna, for forming a second intermediate vector from the received vector r and the channel matrix, the second intermediate vector representing an optimized guess relating to a second one of the set of transmit antennas, for using the second intermediate vector to compute a distance metric and a label metric associated with the first transmit antenna, and for using the distance metrics and label metrics to determine the received information.

17. The apparatus of claim 16, wherein the first intermediate vector is determined using a combination of a first column of the matrix, remaining columns of the matrix, and a matrix X of possible symbols transmitted on the remaining transmit antennas.

18. The apparatus of claim 16, wherein the first intermediate vector is calculated using the following formula:

$$\left[ \frac{\Lambda^{-1}(h_1^* r - h_1^* H_{n \neq 1} X)}{h_1^* h_1} \right]$$

wherein $^{-1}$ is the inverse auto-covariance of any of the transmit antennas, $h_1^*$ is the complex conjugate transpose of $h_1$, and r is the vector r.

* * * * *